(12) United States Patent
Lin et al.

(10) Patent No.: US 12,463,181 B2
(45) Date of Patent: Nov. 4, 2025

(54) MULTI-WAFER INTEGRATION

(71) Applicant: Taiwan Semiconductor Manufacturing Company, Ltd., Hsinchu (TW)

(72) Inventors: Chin-Min Lin, Hsinchu (TW); Hung-Jen Hsu, Taoyuan (TW); Dun-Nian Yaung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/587,406

(22) Filed: Feb. 26, 2024

(65) Prior Publication Data

US 2024/0194650 A1 Jun. 13, 2024

Related U.S. Application Data

(63) Continuation of application No. 17/387,731, filed on Jul. 28, 2021, now Pat. No. 11,916,043.

(60) Provisional application No. 63/195,920, filed on Jun. 2, 2021.

(51) Int. Cl.
| | |
|---|---|
| *H01L 25/065* | (2023.01) |
| *G02B 6/42* | (2006.01) |
| *G02B 6/43* | (2006.01) |
| *H01L 21/48* | (2006.01) |
| *H01L 23/522* | (2006.01) |
| *H01L 23/538* | (2006.01) |

(52) U.S. Cl.
CPC ........ *H01L 25/0657* (2013.01); *G02B 6/4202* (2013.01); *G02B 6/43* (2013.01); *H01L 21/486* (2013.01); *H01L 23/5226* (2013.01); *H01L 23/5386* (2013.01)

(58) Field of Classification Search
CPC ............... H01L 25/0657; H01L 21/486; H01L 23/5226; H01L 23/5386; G02B 6/4202; G02B 6/43
USPC ......................................... 257/774
See application file for complete search history.

(56) References Cited

U.S. PATENT DOCUMENTS

| | | | |
|---|---|---|---|
| 7,056,807 | B2 | 6/2006 | Kellar |
| 10,914,895 | B2 | 2/2021 | Liao |
| 2004/0014308 | A1 | 1/2004 | Kellar |
| 2017/0358562 | A1 | 12/2017 | Banna |
| 2020/0135650 | A1 | 4/2020 | Kuo |
| 2020/0295530 | A1 | 9/2020 | Iida |

FOREIGN PATENT DOCUMENTS

| | | |
|---|---|---|
| CN | 111952255 A | 11/2020 |
| TW | 202013767 A | 4/2020 |
| TW | 202014746 A | 4/2020 |

*Primary Examiner* — Tu-Tu V Ho
(74) *Attorney, Agent, or Firm* — HAYNES AND BOONE, LLP

(57) ABSTRACT

Semiconductor devices and methods of forming the same are provided. A method according to the present disclosure includes forming a first wafer including a plurality of electronic integrated circuits (EICs), forming a second wafer including a plurality of photonic integrated circuits (PICs), bonding the first wafer to the second wafer to form a first stacked wafer. The bonding of the first wafer to the second wafer includes vertically aligning each of the plurality of the EICs with one of the plurality of the PICs.

20 Claims, 20 Drawing Sheets

MULTI-WAFER INTEGRATION

PRIORITY DATA

This application is a continuation application of U.S. patent application Ser. No. 17/387,731, filed Jul. 28, 2021, which claims benefits of U.S. Provisional Application No. 63/195,920, entitled "Multi-Wafer Integration," filed Jun. 2, 2021, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Fiber optic plays an important role in today's ever more digital world. An optic device includes one or more optical engines coupled to and controlled by a switch. As the number of switches increase with data transmission demand, the goal is to increase bandwidth density and reduce power consumption. In some existing technology, such as pluggable optics, optical engines and switches are separately mounted on one or more substrates and are connected by long lead wires. The length of the lead wires increases resistance, leading to increased power consumption and heat generation. As the miniaturization continues to meet bandwidth density demand, power consumption and heat generation continue to pose challenges. Therefore, while existing optic device structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
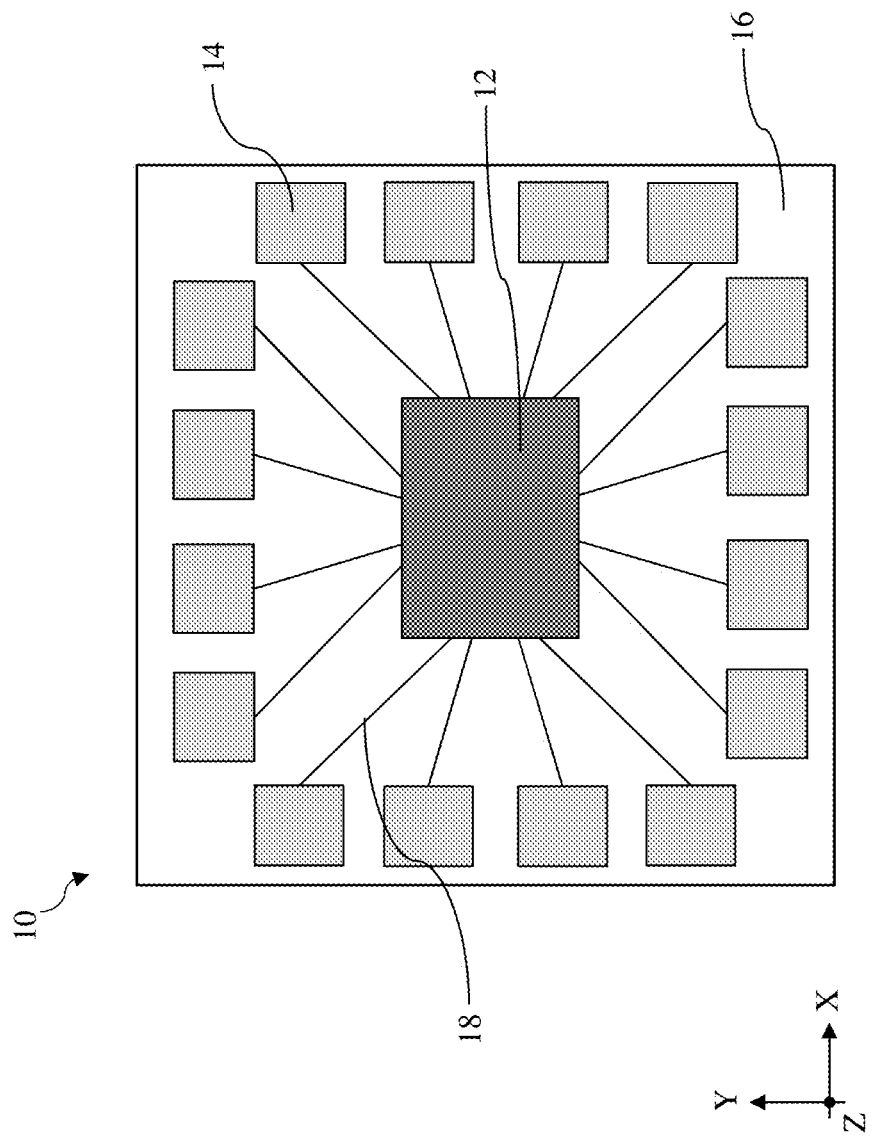
FIG. 1 illustrates an optic device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The high-volume and streamlined efficiency of fiber optic technology has made it indispensable in today's digital age. To improve the bandwidth density and reduce power consumption, optic devices have gone through rounds of improvements. FIG. 1 illustrates an example optic device 10 that implements co-packaging technology. The optic device 10 includes multiple optical engine dies 14 and a switch die 12 mounted on a package substrate 16. The multiple optical engine dies 14 are electrically coupled to the switch die 12 by lead wires 18. Each of the optical engine dies 14 includes an electronic die bonded to a photonic die. The optical device 10 performs well for its intended purposes. That said, the lead wires 18 are formed of copper or other metal and the length of the lead wires may slow the optic device 10 down and increase power consumption and resistive heat generation. Additionally, electronic dies, photonic dies, and the switch die 12 are fabricated on and cut from separate wafers.

The electronic dies and photonic dies are then bonded together to form optical engine dies 14 and the multiple optical engine dies 14 are then mounted on the package substrate 16. It can be seen that the fabrication of the optic device 10 takes several steps and need bonding of several optical engine dies 14.

Figure 2:
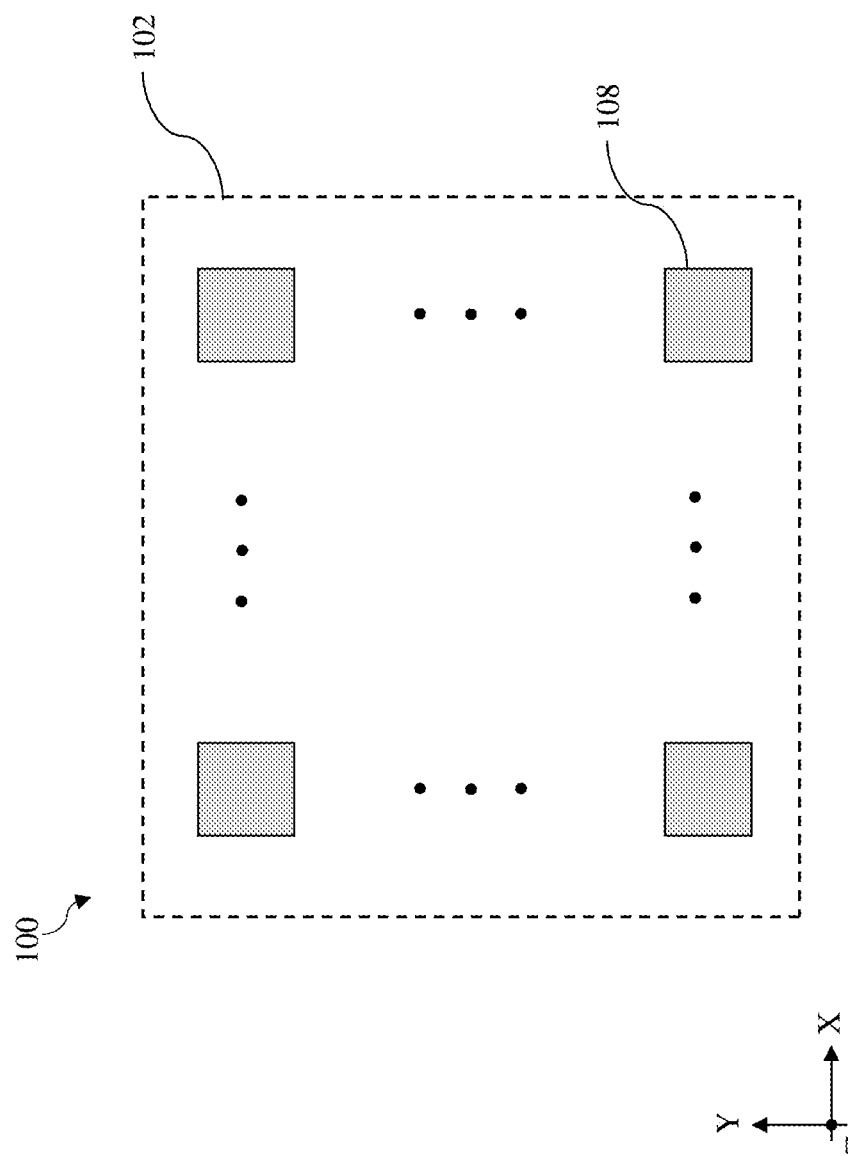
FIGS. 2-9 illustrate various embodiments according to various aspects of the present disclosure.
Figure 3:
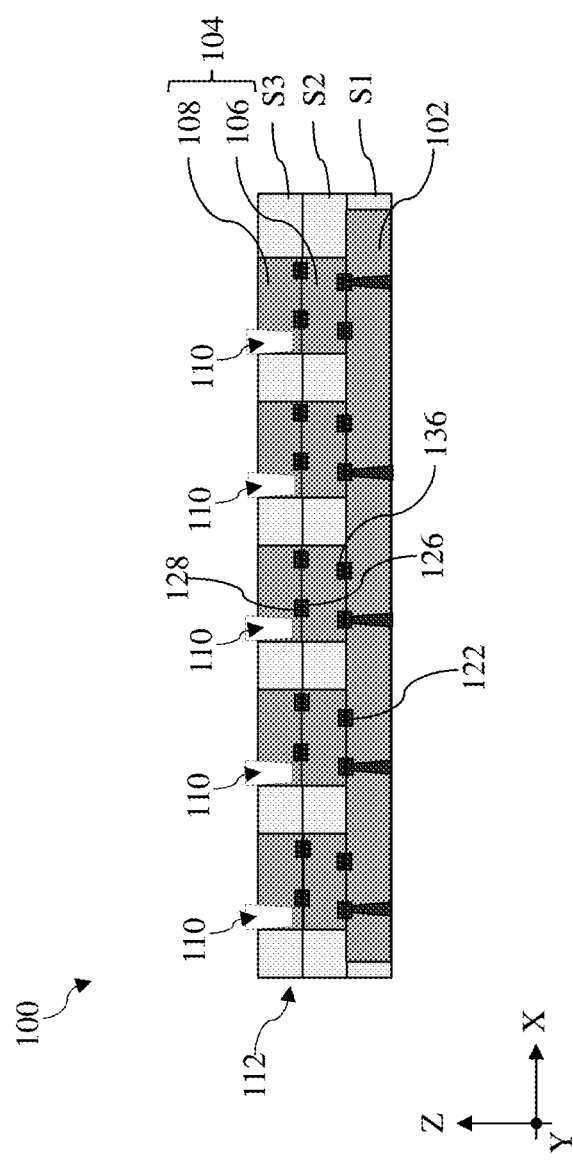

The present disclosure provides a wafer-level stack structure and process to increase bandwidth density, reduce power consumption and lower heat generation. Reference is made to FIGS. 2 and 3. FIG. 2 is a schematic top view of a semiconductor device 100 and FIG. 3 is a schematic cross-sectional view of the semiconductor device 100 along the X direction. In the depicted embodiment, the semiconductor device 100 includes three substrates stacked one over another. A first substrate S1 includes a high-performance computing (HPC) integrated circuit (IC) 102. A second substrate S2 is bonded to the first substrate S1 and includes a plurality of electronic ICs (EICs) 106. A third substrate S3 is bonded to the second substrate S2 and includes a plurality of photonic ICs (PICs) 108. Each of the PICs 108 is vertically aligned with and electrically coupled to one of EICs 106 to form an optical engine 104.

The HPC IC 102 in the semiconductor device 100 may be an application-specific integrated circuit (ASIC) that serves as a switch to control the optical engines 104. The HPC IC 102 may include multiple analog-to-digital converters (ADCs) and digital-to-analog converters (DACs). The PIC 108 may include germanium (Ge) photodiodes or photosensors to detect optical signals, couplers to receive or emit optical signals, waveguides, laser sources, and modulators. The EICs 106 may include drivers (DRVs) and transimpedance amplifiers (TIAs). The optical signal is, for example, pulsed light, light with continuous wave (CW) or the combinations thereof. In some embodiments, a PIC 108 in a semiconductor device 100 receives and emits optical signal with a grating coupler. In those embodiments, the semiconductor device 100 includes optical signal openings 110. According to the present disclosure, the optical signal openings 110 are formed after the 3-level stacked wafer is formed. In some other embodiments, the PICs 108 in the semiconductor device 100 receives and emits optical signal using an edge coupler. When edge couplers are used, the optical signal openings 110 are not formed and the edge couplers are coupled to a side surface 112 of the PIC 108.

Figure 4:
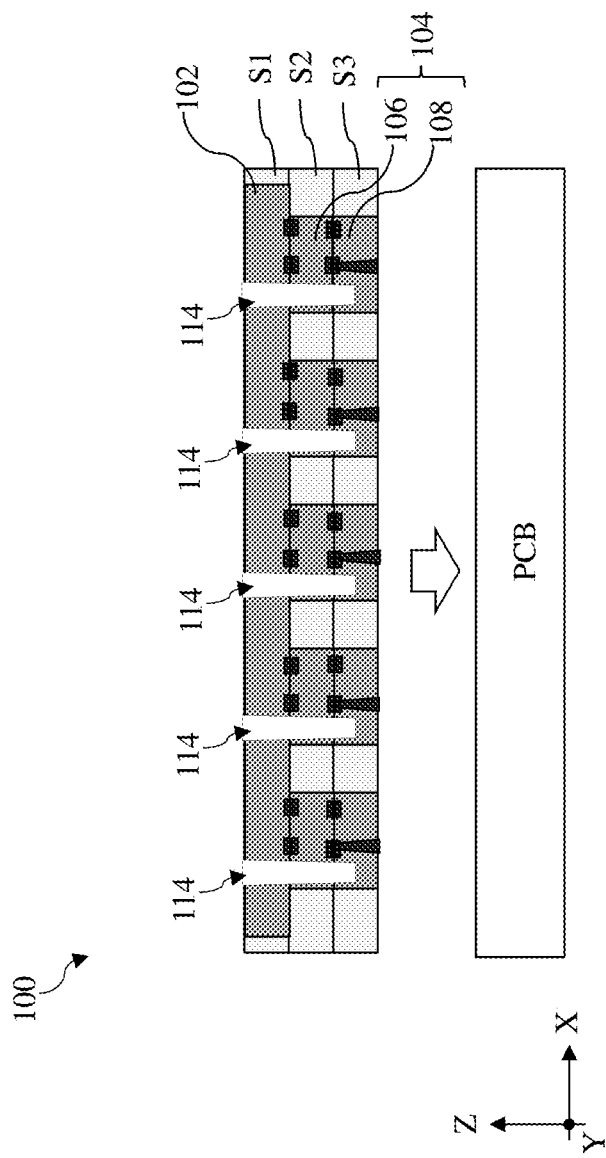

Reference is made to FIG. 4. In some embodiments where the heat generated by the HPC IC 102 is a major concern, a deep optical signal opening 114 may be formed. As shown in FIG. 4, each of the deep optical signal opening 114 extends through the HPC IC 102, an EIC 106, and terminates in a PIC 108. Like the optical signal openings 110 shown in FIG. 3, the deep optical signal openings 114 are configured for formation of grating couplers to receive and emit optical signal. The embodiment shown in FIG. 4 facilitates dissipation of heat generated by the HPC IC 102. As indicated by the arrow sign in FIG. 4, implementation on the deep optical signal openings 114 allows the semiconductor device 100 to be mounted to a printed circuit board (PCB) with the PICs 108 closer to the PCB and the HPC IC 102 away from the PCB. With the HPC IC 102 on the top, the HPC IC 102 may better dissipate heat by convection. In some embodiments not explicitly shown in the figures, the HPC IC 102 is better configured to receive forced convection or water cooling. For example, a cooling fan may be mounted right over the HPC IC 102 to improve dissipation of heat.

Figure 5:
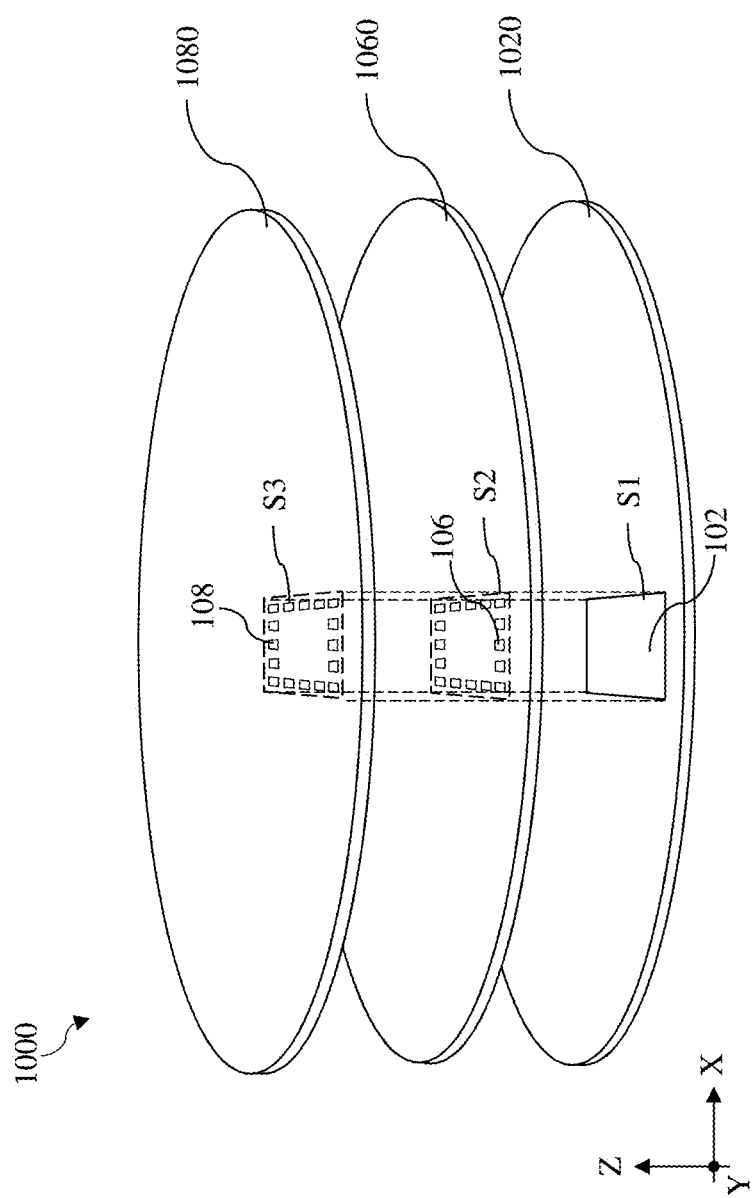
Figure 6:
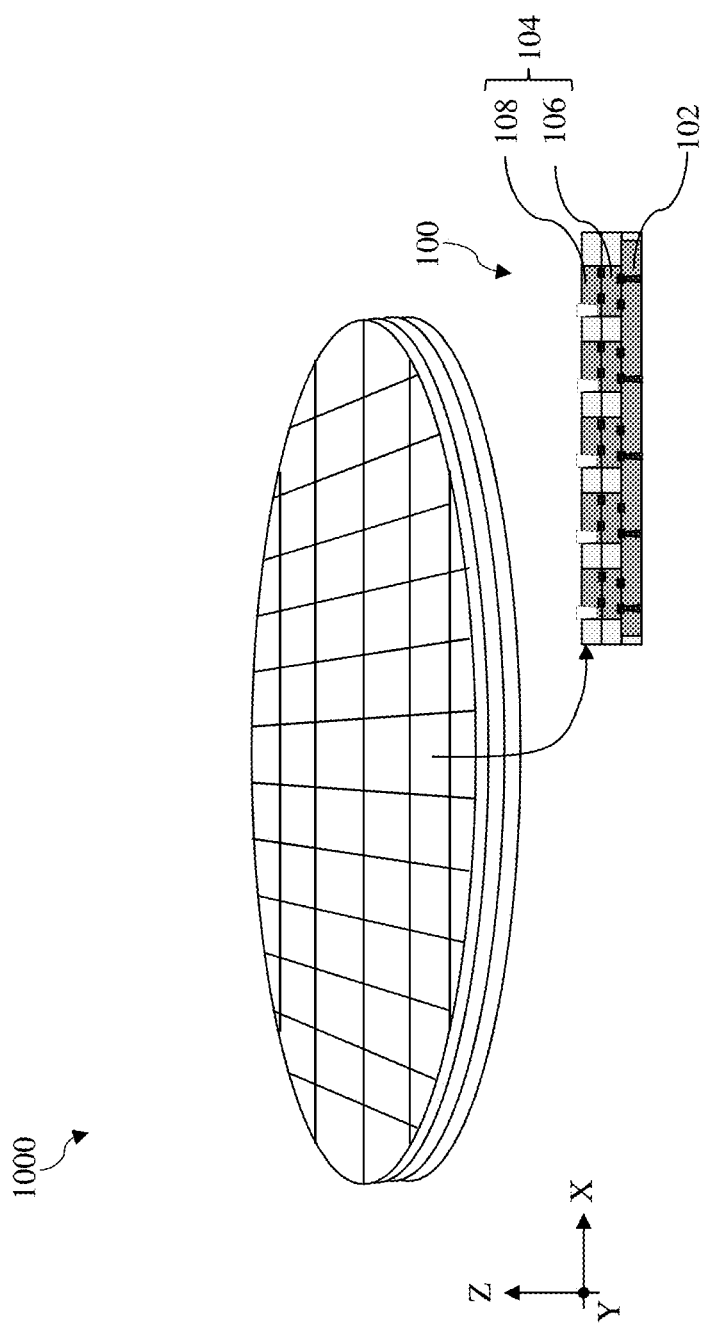

It is noted that none of the EICs 106 or the PICs 108 in the semiconductor device 100 is separately cut into a die before the semiconductor device 100 is formed. Reference is now made to FIG. 5. Each of the first substrate S1, second substrate S2 and the third substrate S3 are originally a portion of an HPC wafer 1020, an EIC wafer 1060 and a PIC wafer 1080. As illustrated in FIG. 5, in some example processes that will be described further below, the HPC wafer 1020, the EIC wafer 1060 and the PIC wafer 1080 are first vertically bonded together to form a 3-level stacked wafer 1000. Referring to FIG. 6, the 3-level stacked wafer 1000 is then cut in a die-cutting process or a singulation process to form the semiconductor device 100 shown in FIGS. 2 and 3. The electrical connections among the HPC IC 102, the EICs 106, and the PICs 108 in the semiconductor device 100 are completed when the 3-level stacked wafer 1000 is formed.

FIG. 5 illustrates an example where the EIC wafer 1060 is first directly bonded to the PIC wafer 1080 by hybrid bonding. In an example hybrid bonding process, exposed dielectric surfaces of the EIC wafer 1060 are bonded to exposed dielectric surfaces of the PIC wafer 1080 and exposed metal surfaces of the EIC wafer 1060 are bonded to exposed metal surfaces of the PIC wafer 1080. A group of EICs 106 on the EIC wafer 1060 are arranged in a rectangular pattern similar to the one shown in FIG. 2. Similarly, a group of PICs 108 on the PIC wafer 1080 are arranged in an identical rectangular pattern. When the EIC wafer 1060 is bonded to the PIC wafer 1080, each of the group of EICs 106 is vertically aligned with one of the group of PICs 108. That is, contact features 126 of an EIC 106 on the EIC wafer 1060 are aligned with contact features 128 of a corresponding PIC 108 on the PIC wafer 1080 such that the EIC 106 and the PIC 108 are electrically and functionally connected to form an optical engine 104. When the HPC wafer 1020 is bonded to EIC wafer 1060 (which is bonded to the PIC wafer 1080) to form the 3-level stacked wafer 1000, each of the HPC ICs 102 on the HPC wafer 1020 is vertically aligned with the group of EICs 106 arranged in the rectangular pattern. Because the group of EICs 106 are connected to the group of PICs 108 to form a group of optical engines 104, a vertical projection area of the group of optical engines 104 falls squarely within a vertical projection area of an HPC IC 102. Put differently, contact features 122 of an HPC IC 102 on the HPC wafer 1020 are electrically and functionally coupled to contact features 136 of the group of EICs 106 on the EIC wafer 1060.

Reference is still made to FIG. 5. The numbers of HPC ICs 102, EICs 106 and the PICs 108 in each of the three wafers 1020, 1060 and 1080 in the 3-level stacked wafer 1000 reflect the structure of the semiconductor device 100. A non-limiting example is described for illustration purposes. When the semiconductor device 100 includes an HPC IC 102 and 16 optical engines 104, the number of EICs 106 on the EIC wafer 1060 is 16 times the number of HPC ICs 102 on the HPC wafer 1020. Similarly, the number of PICs 108 on the PIC wafer 1080 is 16 times the number of HPC ICs 102 on the HPC wafer 1020. As indicated by the dotted lines in FIG. 5, the HPC IC 102 in the area of the first substrate S1 is aligned with the group of EICs 106 in the area of the second substrate S2 as well as the group of PICs 108 in the area of the third substrate S3.

It is noted that all the EICs 106 and the PICs 108 in the semiconductor device 100, shown in FIGS. 1 and 2, are not cut into separate dies before they are bonded to one another and then to the HPC IC 102. That is, after the 3-level stacked wafer 1000 in FIG. 6 is formed, the EICs 106 are still embedded in the same second substrate S2 and the PICs 108 are still in the same third substrate S3. Put differently, the space among the EICs 106 or the space among the PICs 108 are not filled by any molding materials or polymeric material. Additionally, because the first substrate S1, the second substrate S2 and the third substrate S3 in the semiconductor device 100 by hybrid bonding, no molding materials or underfill materials are needed to fill any space between the first substrate S1 and the second substrate S2 or between the second substrate S2 and the third substrate S3. In other words, the semiconductor device 100 itself is free of any molding materials or underfill materials.

Figure 7:
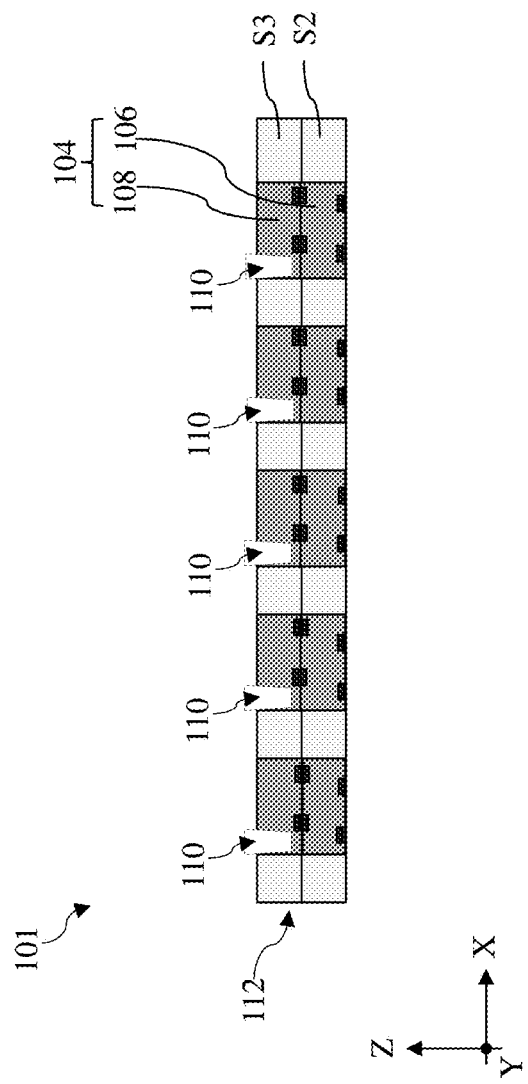
Figure 8:
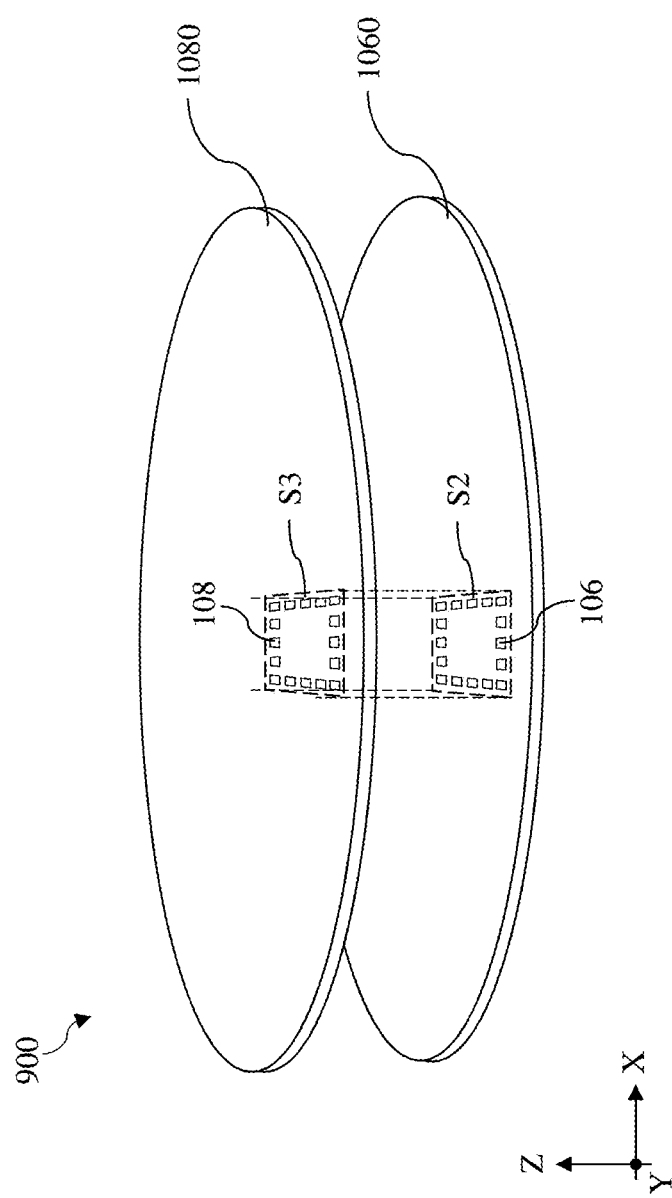
Figure 9:
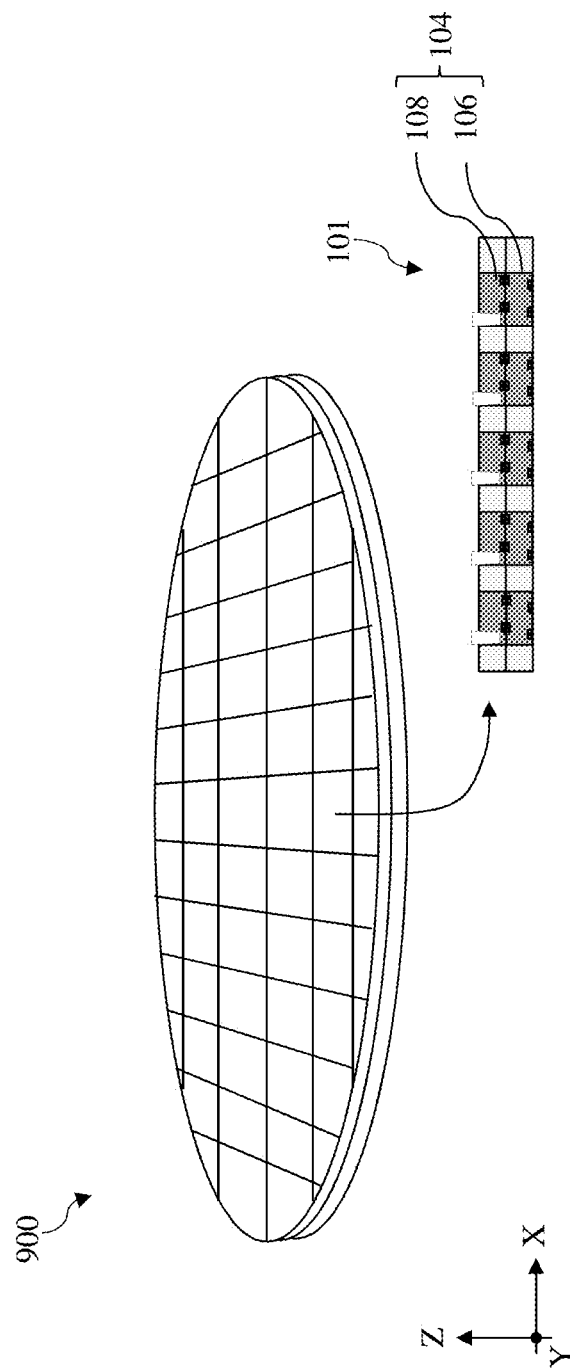

Alternative embodiments are illustrated in FIGS. 7, 8 and 9. FIG. 7 illustrates a semiconductor device 101. As compared with the three-level structure of the semiconductor device 100 shown in FIG. 3 or 4, the semiconductor device 101 includes a two-level structure. The semiconductor device 101 includes a second substrate S2 directly bonded to a third substrate S3. The second substrate S2 includes a plurality of EICs 106 and the third substrate S3 includes a plurality of PICs 108. As shown in FIG. 7, each of the EICs 106 in the second substrate S2 is vertically aligned with one of the PICs 108 in the third substrate S3. Each of EICs 106 is electrically and functionally coupled to one of the PICs 108 to form an optical engine 104.

It is noted that none of the EICs 106 or the PICs 108 in the semiconductor device 101 is separately cut into a die before the semiconductor device 101 is formed. Reference is now made to FIG. 8. Each of the second substrate S2 and the third substrate S3 are originally a portion of an EIC wafer 1060 and a PIC wafer 1080. As illustrated in FIG. 8, in some example processes that will be described further below, the EIC wafer 1060 and the PIC wafer 1080 are first vertically bonded together to form a 2-level stacked wafer 900. Referring to FIG. 9, the 2-level stacked wafer 900 is then cut in a die-cutting process or a singulation process to form the semiconductor device 101 shown in FIG. 7. The electrical connections between the EICs 106 and the PICs 108 in the semiconductor device 101 are completed when the 2-level stacked wafer 900 is formed.

FIG. 8 illustrates an example where the EIC wafer 1060 is directly bonded to the PIC wafer 1080 by hybrid bonding. A group of EICs 106 on the EIC wafer 1060 are arranged in a rectangular pattern. Similarly, a group of PICs 108 on the PIC wafer 1080 are arranged in an identical rectangular pattern. When the EIC wafer 1060 is bonded to the PIC wafer 1080, each of the group of EICs 106 is vertically aligned with one of the group of PICs 108. That is, contact features of an EIC 106 on the EIC wafer 1060 are aligned with contact features of a corresponding PIC 108 on the PIC wafer 1080 such that the EIC 106 and the PIC 108 are electrically and functionally connected to form an optical engine 104.

Figure 10:
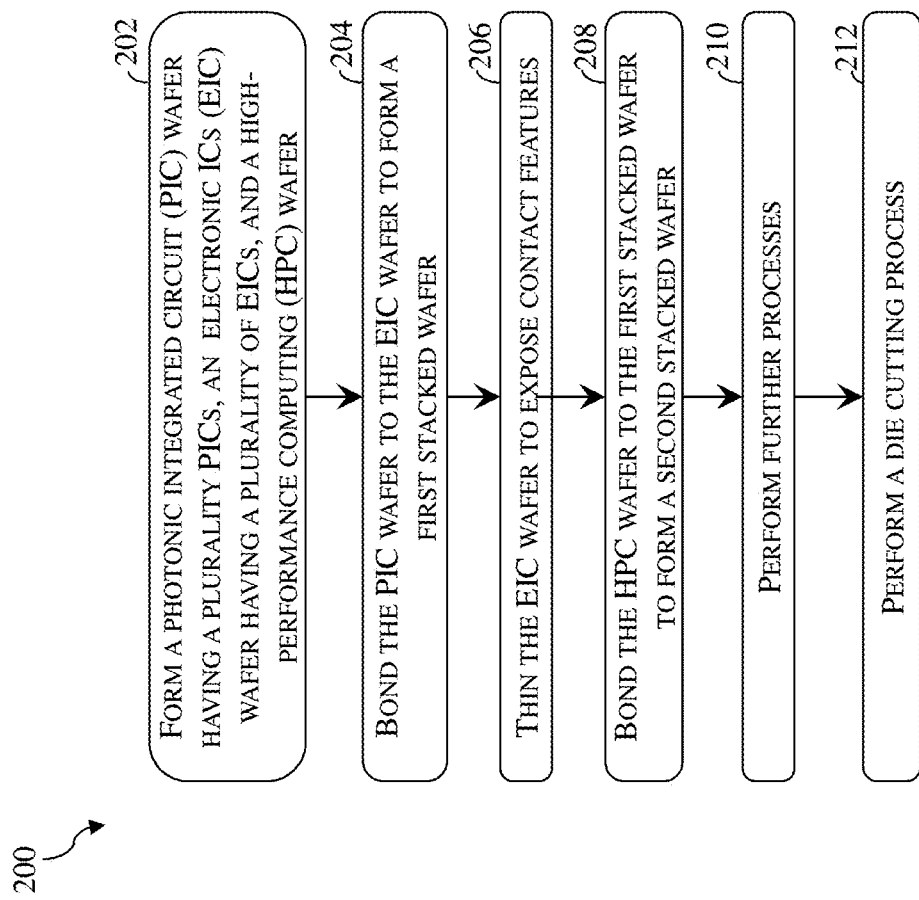
FIG. 10 includes a flowchart of a method 200 of forming a semiconductor device according to various aspects of the present disclosure.

FIG. 10 illustrates a flowchart of a method 200 of forming a semiconductor device 100. Method 200 is merely an example and is not intended to limit the present disclosure to what is explicitly illustrated in method 200. Additional steps may be provided before, during and after method 200, and some steps described can be replaced, eliminated, or moved around for additional embodiments of the methods. Not all steps are described herein in detail for reasons of simplicity. Method 200 is described below in conjunction with FIGS. 11-15, which illustrate perspective views of a 3-level stacked wafer (or a workpiece thereof) at different stages of fabrication according to embodiments of method 200. Throughout the present disclosure, like reference numerals are used to denote like features.

Figure 11:
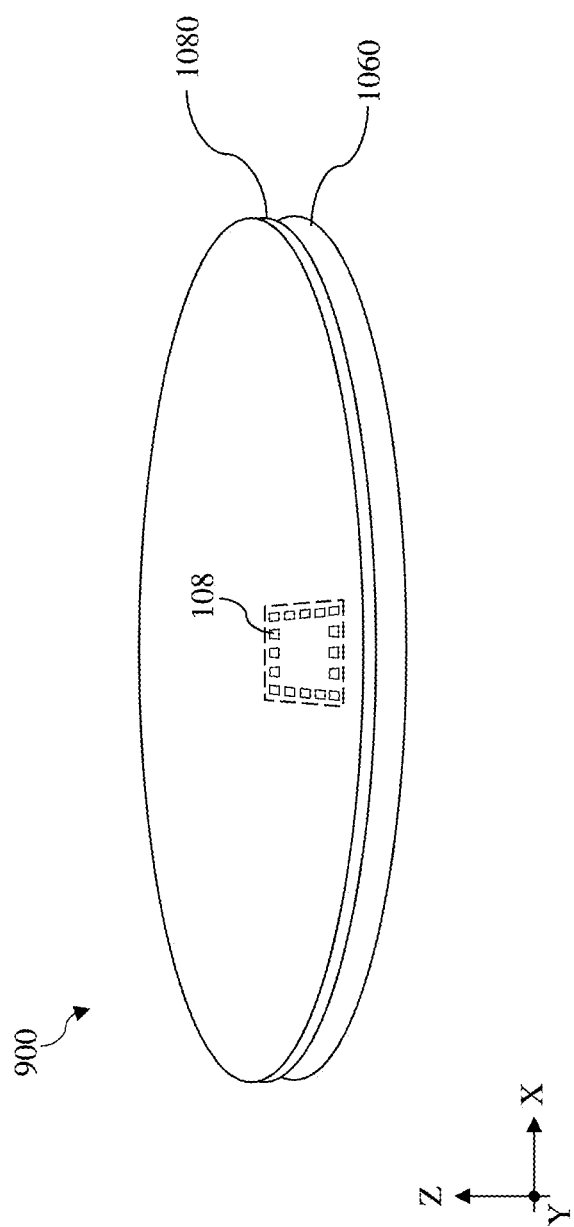
FIGS. 11-15 are schematic illustrations of operations in the method of FIG. 10, according to various aspects of the present disclosure.

Referring to FIGS. 10 and 11, method 200 includes a block 202 where an EIC wafer 1060, a PIC wafer 1080, and an HPC wafer 1020 (not shown in FIG. 11, shown in FIG. 13) are formed. At block 202, various semiconductor fabrication processes are performed to form the EIC wafer 1060, the PIC wafer 1080, and the HPC wafer 1020. The EIC wafer 1060 includes a plurality of EICs 106. The PIC wafer 1080 includes a plurality of PICs 108. The HPC wafer 1020 includes a plurality of HPC ICs 102. The EICs 106 come in groups, each of which is arranged in a rectangular pattern or a substantially rectangular pattern. The PICs 108 come in groups, each of which is arranged in a pattern corresponding to the pattern of the EICs 106. This is to ensure that, when the EIC wafer 1060 is vertically aligned with the PIC wafer 1080, each of the contact features on each of the EICs 106 is vertically aligned with a corresponding contact feature on one of the PICs 108. When the EIC wafer 1060 is later bonded to the PIC wafer 1080 by hybrid bonding, each of the EICs 106 is electrically and functionally coupled to one of the PICs 108 to form an optical engine 104.

Each of the HPC ICs 102 may be an application-specific integrated circuit (ASIC) and may include multiple analog-to-digital converters (ADCs) and digital-to-analog converters (DACs). More specifically, an HPC IC 102 may include multi-channel transistors and an interconnect structure that interconnects the multi-gate transistors. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. The interconnect structure in an HPC IC 102 may include metal layers, each of which includes conductive lines embedded in an intermetal dielectric (IMD) layer. Conductive lines in different metal layers are interconnected by contact vias that provide vertical electrical connection. In some embodiments, passive devices or memory devices may be incorporated in the interconnect structure. For example, a metal-insulator-metal (MIM) capacitor or a magnetoresistive random access memory (MRAM) device may be formed in an interconnect structure. Each of the HPC IC 102 may serve as a switch to control optical engines 104 that each include an EIC 106 and a PIC 108. To provide electrical interconnection, the HPC substrate may include through-silicon vias (TSVs).

Each of the EICs 106 may include drivers (DRVs) and transimpedance amplifiers (TIAs) to drive a PIC 108 and to amplify electrical signal from the PIC 108. In some embodiments, an EIC 106 may include multi-gate transistors and resistors. Each of the PICs 108 may include germanium (Ge) photodiodes to detect optical signals, couplers to receive or emit optical signals, waveguides, laser sources, and modulators. A coupler in a PIC 108 may be a grating coupler, an edge coupler, or a suitable coupler. An edge coupler engages an optical fiber from an edge of a PIC and may be a tapered edge coupler or an inversely edge coupler. A grating coupler receives optical signal from an optical fiber coming down to the PIC along a vertical direction (Z direction). To provide electrical interconnection, the PIC substrate may include through-silicon vias (TSVs).

Referring to FIGS. 10 and 11, method 200 includes a block 204 where the PIC wafer 1080 is bonded to the EIC wafer 1060 to form a first stacked wafer 900 such that each of the PICs 108 is vertically aligned with one of the EICs 106. According to the present disclosure, the PIC wafer 1080 is directly bonded to the EIC wafer 1060 without use of solder bumps. In some embodiments, the PIC wafer 1080 is bonded to the EIC wafer 1060 by hybrid bonding. An example hybrid bonding process may include a plurality of chemical mechanical polishing (CMP) steps to provide highly flat bonding surfaces, cleaning steps to clean the bonding surfaces (including dielectric surfaces and metal surfaces), surface activation steps to activate the bonding surfaces, a wafer-to-wafer alignment step and an annealing/bonding step. At block 204, the PIC wafer 1080 is vertically aligned with the EIC wafer 1060 such that each of the EICs 106 may be electrically and functionally coupled to one of the PICs 108. The first stacked wafer 900 is similar to the 2-level stacked wafer 900 described above.

Figure 12:
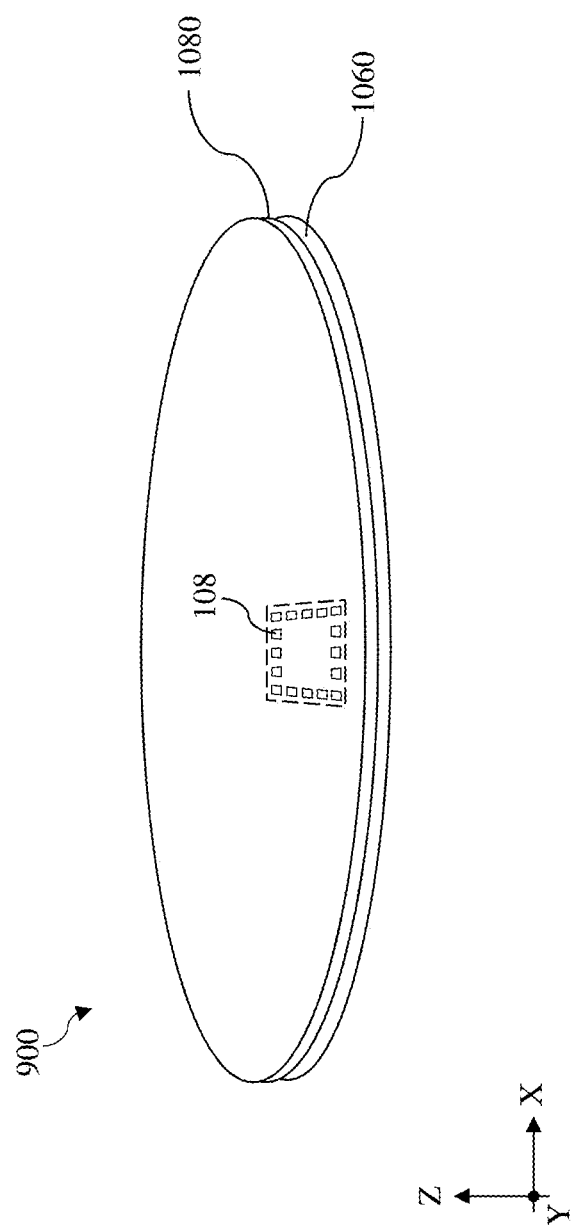

Referring to FIGS. 10 and 12, method 200 includes a block 206 where the EIC wafer 1060 is thinned to expose contact features. At block 206, the first stacked wafer 900 is subjected to a planarization process, such as one or more chemical mechanical polishing (CMP) processes, to remove excess substrate materials. The goal of the planarization process is to provide a highly flat surface and to expose contact features. In the subsequent bonding process at block 208, the exposed contact features will be bonded to contact features on the HPC wafer 1020.

Figure 13:
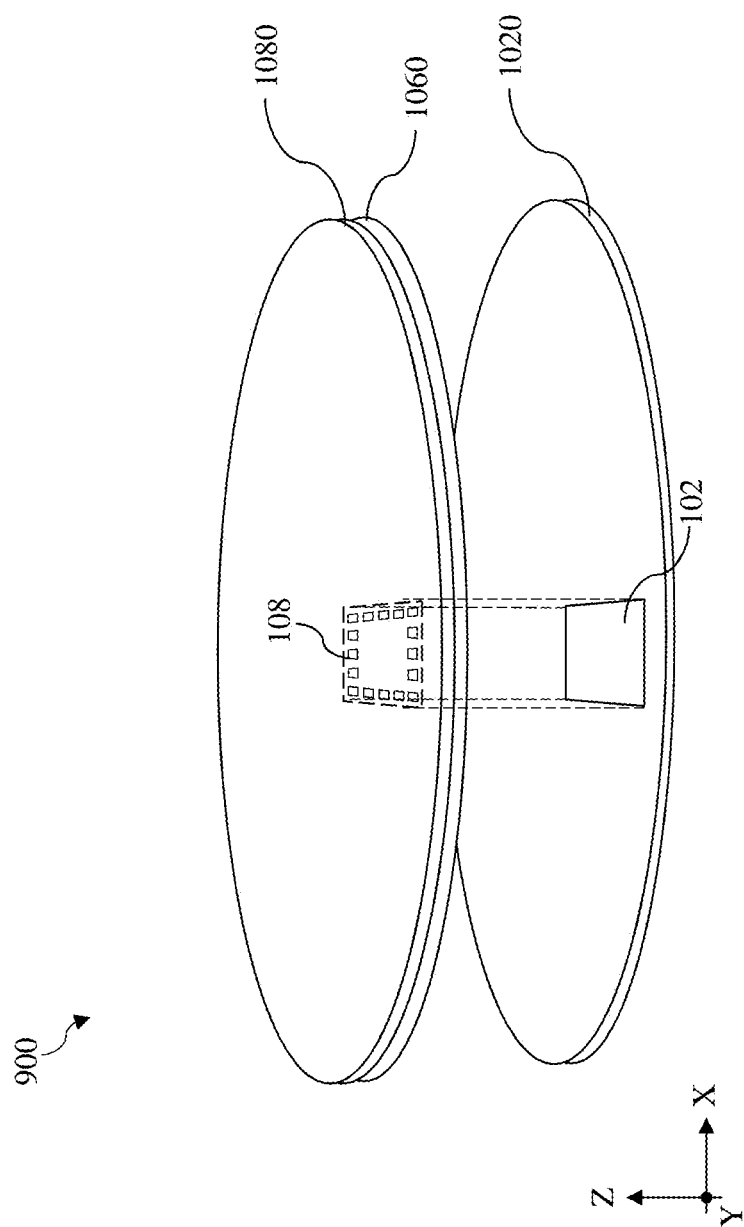

Referring to FIGS. 10 and 13, method 200 includes a block 208 where the HPC wafer 1020 is bonded to the first stacked wafer 900 to form a second stacked wafer 1000. The second stacked wafer 1000 is similar to the 3-level stacked wafer 1000 described above. As illustrated in FIG. 13, at block 208, the first stacked wafer 900 and the HPC wafer 1020 are vertically aligned such that each of the HPC ICs 102 on the HPC wafer 1020 is aligned with a group of EICs 106 on the EIC wafer 1060, where the group of EICs 106 are arranged in a rectangular pattern or a substantially rectangular pattern. Because each of the EICs 106 is vertically aligned to one of the PICs 108, each of the HPC ICs 102 is also vertically aligned with a group of PICs 108 on the PIC wafer 1080. The number of the group of EICs 106 or PICs 108 in the rectangular pattern may be between about 10 and about 100.

The first stacked wafer 900 to the HPC wafer 1020 may be bonded by hybrid bonding or a suitable direct bonding process. An example hybrid bonding process may include cleaning steps to clean the bonding surfaces, surface activation steps to activate the bonding surfaces, a wafer-to-wafer alignment step and an annealing/bonding step. At the conclusion of the operations at block 208, a second stacked wafer 1000 is formed. The second stacked wafer 1000 includes the PIC wafer 1080, the thinned EIC wafer 1060 and the HPC wafer 1020.

Figure 14:
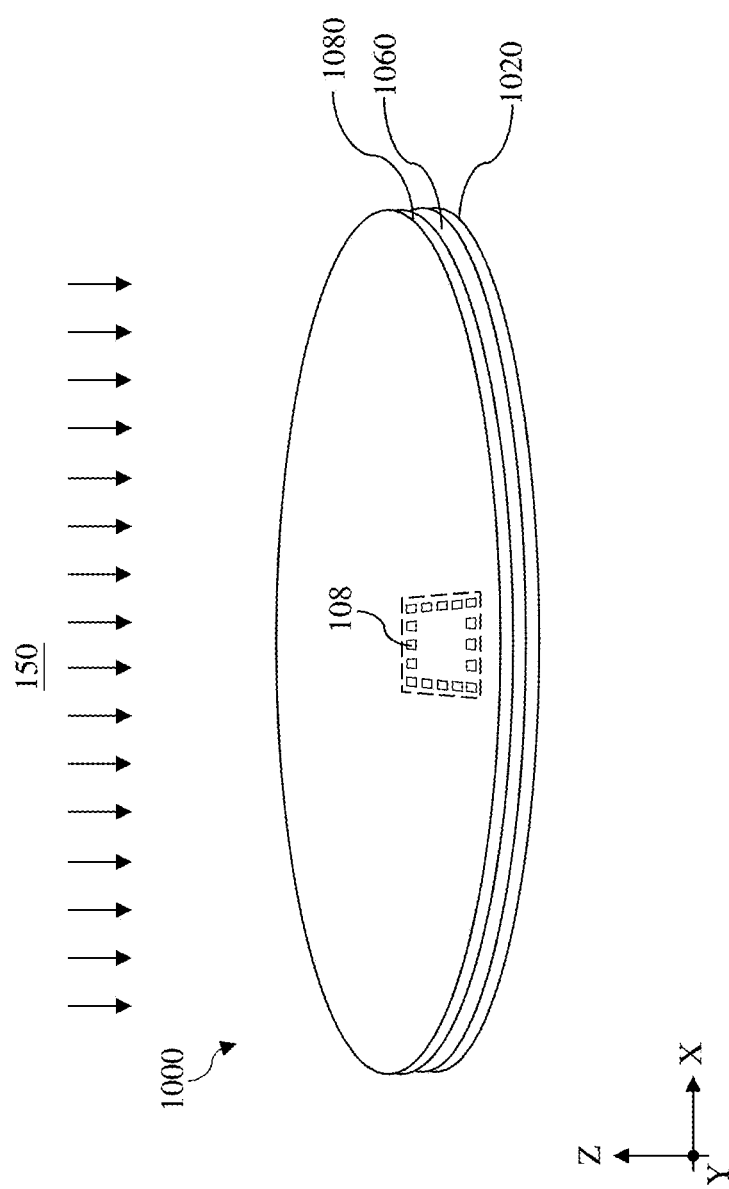

Referring to FIGS. 10 and 14, method 200 includes a block 210 where further processes are performed. Such further processes may include an opening formation process 150 to form optical signal opening 110 on each of PICs 108, planarization of the second stacked wafer 1000 to expose contact features, formation of a redistribution layer on the second stacked wafer 1000, formation of under-bump metallization (UBM) features over the redistribution layer, and formation of solder bumps over the UBM features. In embodiments where the PICs 108 include grating couplers, the opening formation process 150 is performed to form an optical signal opening 110 on each of the PICs 108. The opening formation process 150 may include photolithography steps and etching steps. In an example process, one or more hard masks are deposited over the second stacked wafer 1000. A photoresist layer is deposited over the one or more hard masks. After the photoresist layer is patterned using photolithography techniques, the one or more hard masks are then etched using the patterned photoresist layer as an etch mask. The etch process at block 210 may be an anisotropic dry etch process that may include use of hydrogen, a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some alternative embodiments where maximum cooling is desired, deep optical signal openings 114 shown in FIG. 4 may be formed at block 210. As described below, the deep optical signal openings 114 allows the HPC IC 102 to be on the top surface of the second stacked wafer 1000, which may receive cooling by forced convection or even water cooling. In some instances, a heat sink may be formed on the top surface of the HPC IC 102 to dissipate heat. It is noted that the opening formation process 150 is performed after the second stacked wafer 1000 is formed. In some embodiments where the PICs 108 include edge couplers, the opening formation process 150 may be omitted.

Operations at block 210 also includes forming a redistribution layer over the second stacked wafer 1000. The redistribution layer may include one or more inter-dielectric layers and one or more patterned conductive layers stacked alternately. The inter-dielectric layers may include silicon oxide, tetraethoxysilane (TEOS), silicon nitride, silicon oxynitride, or other suitable dielectric materials. The patterned conductive layers may be patterned copper layers or other suitable patterned metal layers, and the patterned conductive layers may be formed by electroplating or deposition. However, the present disclosure is not limited thereto. In some embodiments, the patterned conductive layers may be formed by dual-damascene method. In embodiments where the deep optical signal openings 114 are formed, the redistribution layer is formed on the PIC substrate. In embodiments where edge couplers are used, the redistribution layer may be formed on the HPC substrate or the PIC substrate.

After the redistribution layer is formed, a plurality of under-bump metallurgy (UBM) features are formed on the redistribution layer. The UBM features are mechanically contacting the top surface of the topmost layer of the patterned conductive layers in the redistribution layer. In some embodiments, the material of the UBM features may include copper, nickel, titanium, tungsten, or alloys thereof or the like, and may be formed by an electroplating process. After the formation of the UBM features, solder bumps are formed on the UBM features before the die 100 is bonded to a PCB by way of the solder bumps. In embodiments where the optical signal openings 110 are formed, the redistribution layer is formed on the HPC substrate.

Figure 15:
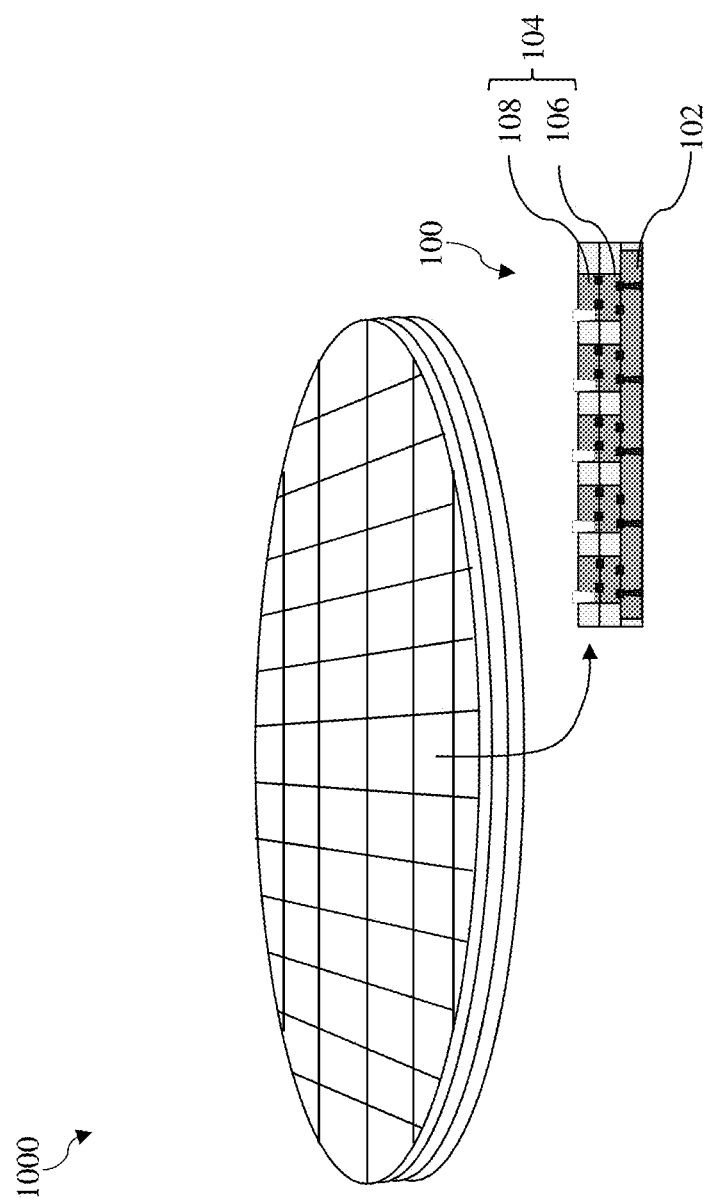

Referring to FIGS. 10 and 15, method 200 includes a block 212 where a die cutting process is performed to cut the second stacked wafer 1000 into dies 100. The die cutting process may also be referred a singulation process, a dicing process or a wafer dicing process. The die cutting process may include use mechanical blade sawing, laser cutting, or a suitable cutting technique. The die cutting process at block 212 tracks the shape of each of the HPC IC 102 as well as the group of EICs 106 or PICs 108 that are vertically aligned with the HPC IC 102. As shown in FIG. 15, each of dies 100 cut from the second stacked wafer 1000 includes three stacked substrates—the HPC substrate, the EIC substrate and the PIC substrate. These three substrates are formed of semiconductor materials, semiconductor oxide, or semiconductor nitride. Spaces among EICs 106 or among PICs 108 are not filled with a molding material or a polymeric filler material. The die 100 may also be referred to as the semiconductor device 100.

Figure 16:
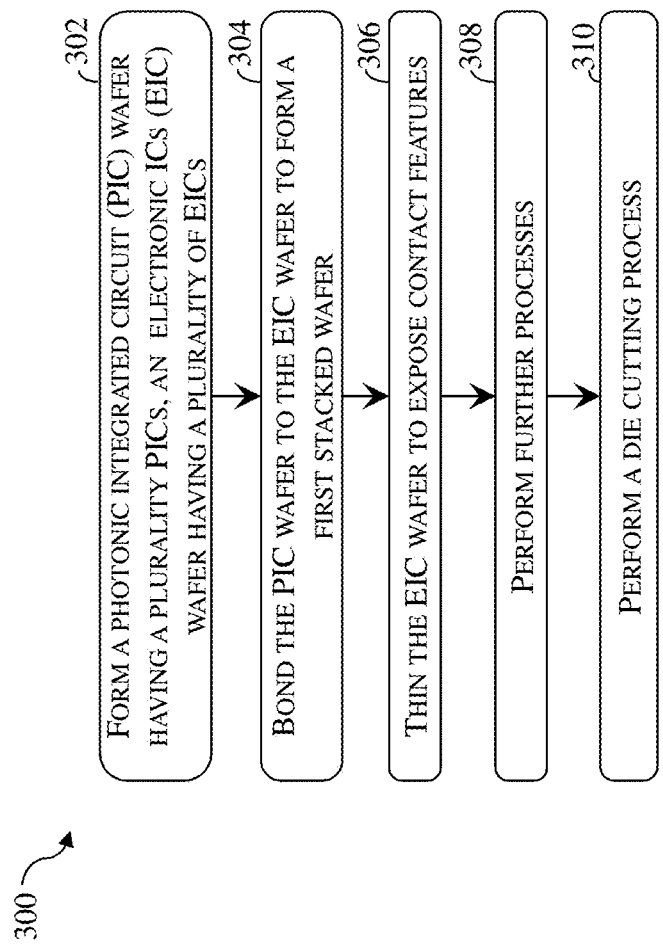
FIG. 16 includes a flowchart of a method 300 of forming a semiconductor device according to various aspects of the present disclosure.

FIG. 16 illustrate a flowchart of a method 300 of forming a semiconductor device 101. Method 300 is merely an example and is not intended to limit the present disclosure to what is explicitly illustrated in method 300. Additional steps may be provided before, during and after method 300, and some steps described can be replaced, eliminated, or moved around for additional embodiments of the methods. Not all steps are described herein in detail for reasons of simplicity. Method 300 is described below in conjunction with FIGS. 16-20, which illustrate perspective views of a 2-level stacked wafer at different stages of fabrication according to embodiments of method 300.

Figure 17:
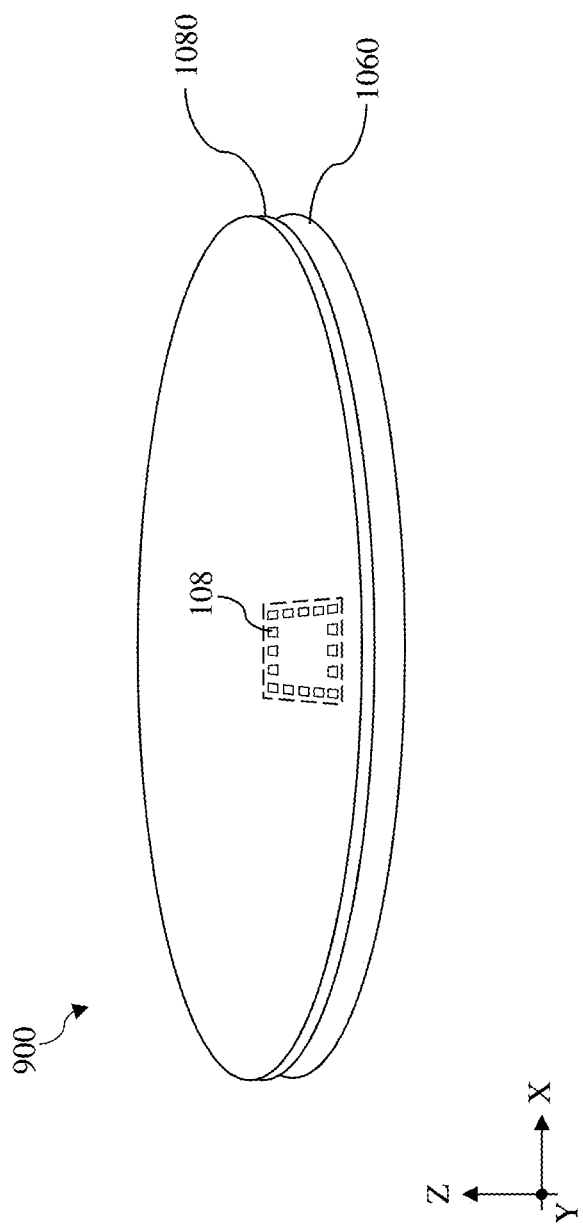
FIGS. 17-20 are schematic illustrations of operations in the method of FIG. 16, according to various aspects of the present disclosure.

Referring to FIGS. 16 and 17, method 300 includes a block 302 where an EIC wafer 1060 and a PIC wafer 1080 are formed. At block 302, various semiconductor fabrication processes are performed to form the EIC wafer 1060 and the PIC wafer 1080. The EIC wafer 1060 includes a plurality of EICs 106. The PIC wafer 1080 includes a plurality of PICs 108. The EICs 106 come in groups, each of which is arranged in a rectangular pattern or a substantially rectangular pattern. The PICs 108 also come in groups, each of which is arranged in a pattern corresponding to the pattern of the EICs 106. This is to ensure that, when the EIC wafer 1060 is vertically aligned with the PIC wafer 1080, each of the contact features on each of the EICs 106 is vertically aligned with a corresponding contact feature on one of the PICs 108. When the EIC wafer 1060 is later bonded to the PIC wafer 1080 by hybrid bonding, each of the EICs 106 is electrically and functionally coupled to one of the PICs 108 to form an optical engine 104.

Each of the EICs 106 may include drivers (DRVs) and transimpedance amplifiers (TIAs) to drive a PIC 108 and to amplify electrical signal from the PIC 108. In some embodiments, an EIC 106 may include multi-gate transistors and resistors. Each of the PICs 108 may include germanium (Ge) photodiodes or photosensors to detect optical signals, couplers to receive or emit optical signals, waveguides, laser sources, and modulators. A coupler in a PIC 108 may be a grating coupler, an edge coupler, or a suitable coupler. An edge coupler engages an optical fiber from an edge of a PIC and may be a tapered edge coupler or an inversely edge coupler. A grating coupler receives optical signal from an optical fiber coming down to the PIC along a vertical direction (Z direction). To provide electrical interconnection, the PIC substrate may include through-silicon vias (TSVs).

Referring to FIGS. 16 and 17, method 300 includes a block 304 where the PIC wafer 1080 is bonded to the EIC wafer 1060 to form a first stacked wafer 900 such that each of the PICs 108 is vertically aligned with one of the EICs 106. According to the present disclosure, the PIC wafer 1080 is directly bonded to the EIC wafer 1060 without use of solder bumps. In some embodiments, the PIC wafer 1080 is bonded to the EIC wafer 1060 by hybrid bonding. An example hybrid bonding process may include a plurality of chemical mechanical polishing (CMP) steps to provide highly flat bonding surfaces, cleaning steps to clean the bonding surfaces, surface activation steps to activate the bonding surfaces, a wafer-to-wafer alignment step and an annealing/bonding step. At block 304, the PIC wafer 1080 is vertically aligned with the EIC wafer 1060 such that each of the EICs 106 may be electrically and functionally coupled to one of the PICs 108.

Figure 18:
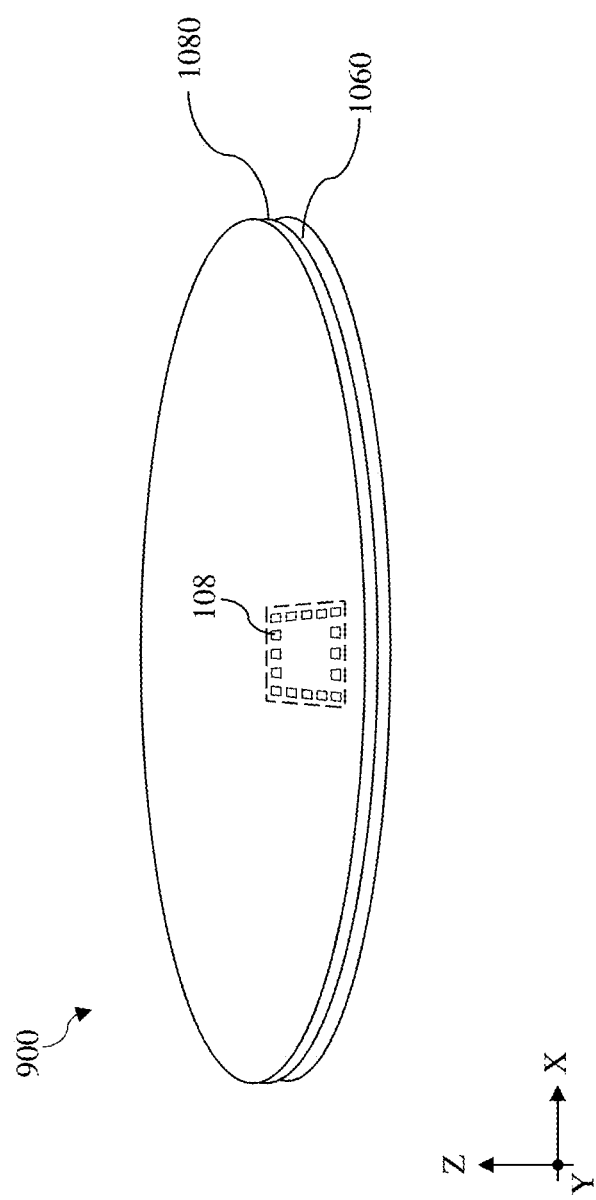

Referring to FIGS. 16 and 18, method 300 includes a block 306 where the EIC wafer 1060 is thinned to expose contact features. At block 306, the first stacked wafer 900 is subjected to a planarization process, such as one or more chemical mechanical polishing (CMP) processes, to remove excess substrate materials. The goal of the planarization process is to expose contact features on the EIC wafer 1060. In further processes at block 312, a redistribution layer is formed over and electrically coupled to the exposed contact features.

Figure 19:
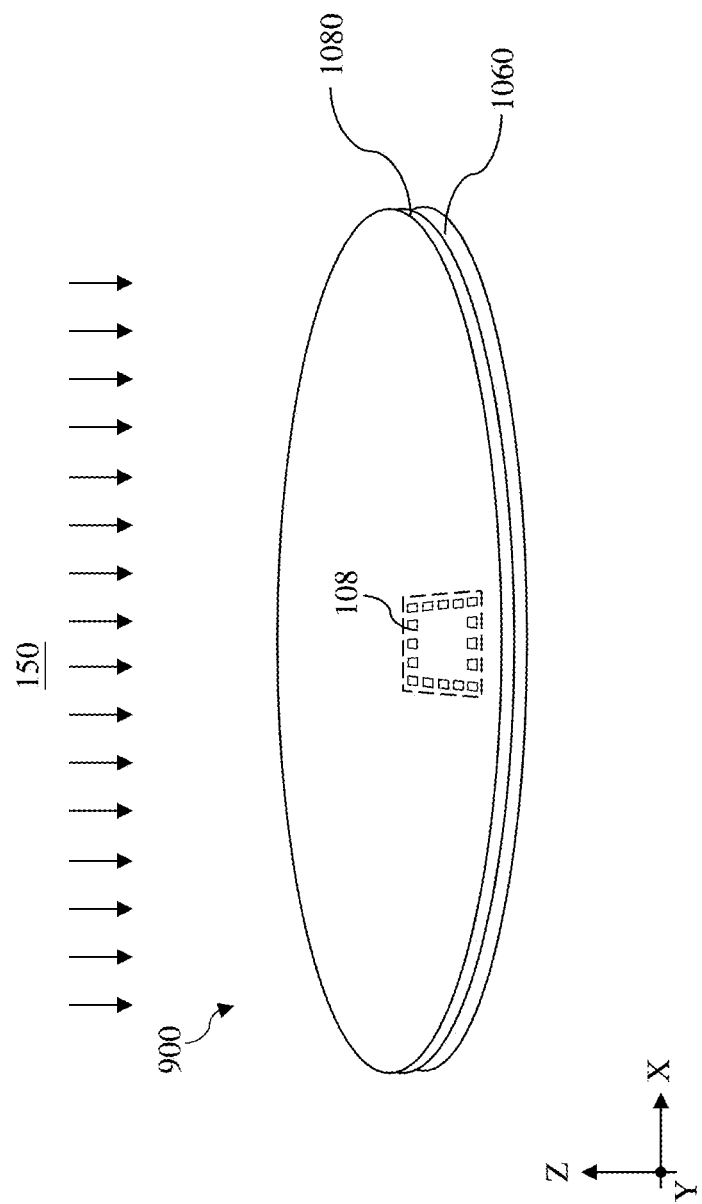

Referring to FIGS. 16 and 19, method 300 includes a block 308 where further processes are performed. Such further processes may include an opening formation process 150 to form optical signal opening 110 on each of PICs 108, formation of a redistribution layer on the first stacked wafer 900, formation of under-bump metallization (UBM) features over the redistribution layer, and formation of solder bumps over the UBM features. In embodiments where the PICs 108 include grating couplers, the opening formation process 150 is performed to form an optical signal opening 110 on each of the PICs 108. The opening formation process 150 may include photolithography steps and etching steps. In an example process, one or more hard masks are deposited over the second stacked wafer 1000. A photoresist layer is deposited over the one or more hard masks. After the photoresist layer is patterned using photolithography techniques, the one or more hard masks are then etched using the patterned photoresist layer as an etch mask. The etch process at block 308 may be an anisotropic dry etch process that may include use of hydrogen, a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some alternative embodiments where the PICs 108 include edge couplers, the opening formation process 150 may be omitted.

Operations at block 308 also includes forming a redistribution layer over the first stacked wafer 900. The redistribution layer may include one or more interlayer dielectric layers and one or more patterned conductive layers stacked alternately. The interlayer dielectric layers may include silicon oxide, tetraethoxysilane (TEOS), silicon nitride, silicon oxynitride, or other suitable dielectric materials. The patterned conductive layers may be patterned copper layers or other suitable patterned metal layers, and the patterned conductive layers may be formed by electroplating or deposition. However, the present disclosure is not limited thereto. In some embodiments, the patterned conductive layers may be formed by dual-damascene method. In embodiments where edge couplers are used, the redistribution layer may be formed on the HPC substrate or the PIC substrate.

After the redistribution layer is formed, a plurality of under-bump metallurgy (UBM) features are formed on the redistribution layer. The UBM features are mechanically contacting the top surface of the topmost layer of the patterned conductive layers in the redistribution layer. In some embodiments, the material of the UBM features may include copper, nickel, titanium, tungsten, or alloys thereof or the like, and may be formed by an electroplating process. After the formation of the UBM features, solder bumps are formed on the UBM features. In embodiments where the optical signal openings 110 are formed, the redistribution layer is formed on the HPC substrate.

Figure 20:
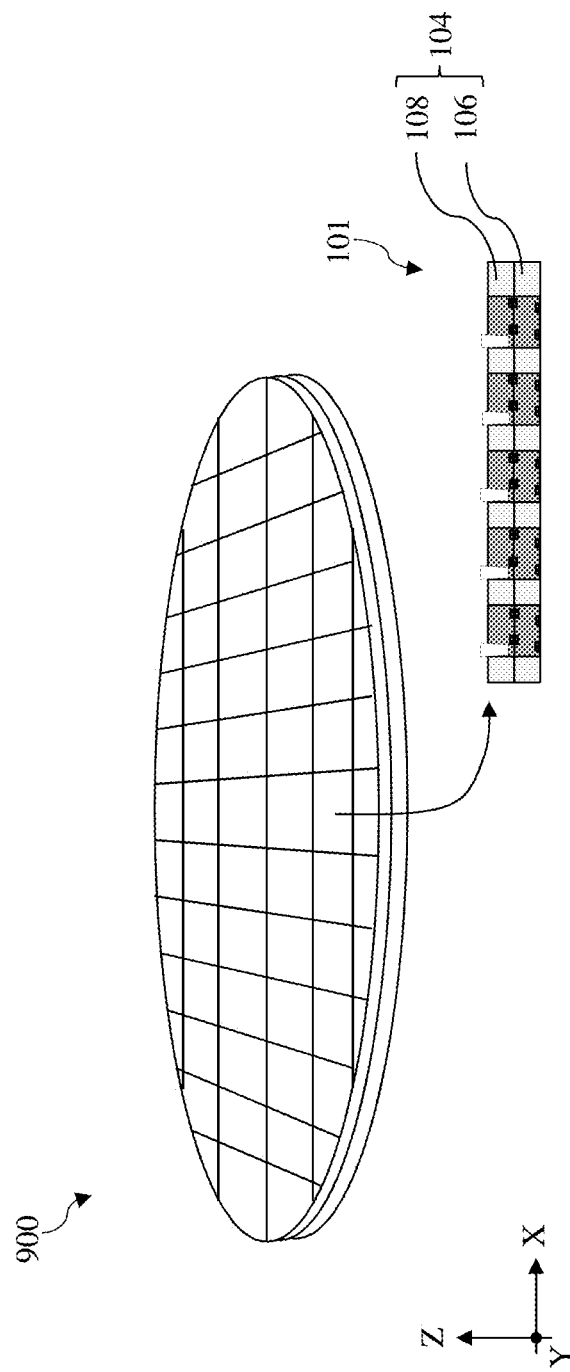

Referring to FIGS. 16 and 20, method 300 includes a block 310 where a die cutting process is performed to the first stacked wafer 900 to form dies 101. The die cutting process may also be referred a singulation process, a dicing process or a wafer dicing process. The die cutting process may include use mechanical blade sawing, laser cutting, or a suitable cutting technique. The die cutting process at block 310 tracks the rectangular shapes of EICs 106 on the EIC wafer 1060 as well as the rectangular shape of the PICs 108 on the PIC wafer 1080. As shown in FIG. 20, each of dies 101 cut from the first stacked wafer 900 includes two stacked substrates—the PIC substrate and the EIC substrate. The PIC substrate and the EIC substrate are formed of semiconductor materials, semiconductor oxide, or semiconductor nitride. Spaces among EICs 106 or among PICs 108 are not filled with a molding material or a polymeric filler material. The die 101 may also be referred to as the semiconductor device 101.

The stacked wafer construction of the present disclosure provides benefits. In an example method according to the present disclosure, an HPC wafer, an EIC wafer and a PIC wafer are formed and directly bonded to one another by hybrid bonding before they are diced into dies. EICs on the EIC wafer are vertically aligned with and electrically coupled to PICs on the PIC wafer to form optical engines. The optical engines come in groups that are arrangement in rectangular pattern. Each of the rectangular pattern is vertically aligned with an HPC IC on the HPC wafer. Each HPC IC is electrically and functionally coupled to the group of optical engines. The HPC IC serves as a switch to control the optical engines. The stacked wafer construction of the present disclosure minimizes wire connection lengths between the switch and the optical engines, thereby reduce power consumption and minimize heat generation. Additionally, the wafer level stacking and integration reduces process complexity.

In one aspect, the present disclosure provides a method. The method includes forming a first wafer including a plurality of electronic integrated circuits (EICs), forming a second wafer including a plurality of photonic integrated circuits (PICs), and bonding the first wafer to the second wafer to form a first stacked wafer. The bonding of the first wafer to the second wafer includes vertically aligning each of the plurality of the EICs with one of the plurality of the PICs.

In some embodiments, each of the plurality of PICs includes photodiodes, waveguides, and modulators. In some implementations, the plurality of EICs are free of photodiodes, waveguides, and modulators. In some instances, the bonding includes bonding the first wafer to the second wafer by hybrid bonding. In some embodiments, after the bonding of the first wafer to the second wafer, each of the plurality of the EICs on the first wafer is electrically coupled to one of the plurality of the PICs on the second wafer to form an optical engine. In some embodiments, the method may further include performing a die cutting process to cut the first stacked wafer into a plurality of dies, each of the plurality of dies including a plurality of optical engines. In some embodiments, the method may further include forming a third wafer including a plurality of high-performance computing (HPC) ICs, bonding the third wafer to the first stacked wafer to form a second stacked wafer such that each of the plurality of HPC ICs is electrically coupled to a number of the plurality of EICs, and performing a die cutting process to cut the second stacked wafer into a plurality of dies. In some implementations, each of the plurality of dies includes one HPC IC, the number of the EICs, and the number of the PICs. In some embodiments, the number is between about 10 and about 100. In some instances, the method further includes etching the first stacked wafer to form an optical signal opening over each of the plurality of PICs to expose a grating coupler in each of the plurality of PICs.

In another aspect, the present disclosure provides a method. The method includes forming a first wafer comprising a plurality of electronic integrated circuits (EICs), forming a second wafer comprising a plurality of photonic integrated circuits (PICs), forming a third wafer comprising a plurality of high-performance computing (HPC) ICs, bonding the first wafer to the second wafer to form a first stacked wafer, bonding the first stacked wafer to the third wafer to form a second stacked wafer, and etching the second stacked wafer to form an optical signal opening over each of the plurality of PICs.

In some embodiments, the method may further include before the bonding the first stacked wafer to the third wafer, thinning the first stacked wafer. In some implementations, the bonding of the first wafer to the second wafer and the bonding of the first stacked wafer to the third wafer include use of hybrid bonding. In some instances, the bonding of the first wafer to the second wafer includes vertically aligning each of the plurality of the EICs with one of the plurality of the PICs. In some embodiments, the bonding of the first stacked wafer to the third wafer includes vertically aligning each of the HPC IC with a number of the plurality of EICs. In some instances, the etching of the second stacked wafer includes etching the optical signal opening from the third wafer and through the first wafer and the optical signal opening terminates in the second wafer. In some embodiments, the method may further include performing a die cutting process to cut the second stacked wafer into a plurality of dies. Each of the plurality of dies includes one HPC IC, a number of the plurality of EICs, and the number of the plurality of PICs. In some embodiments, the method may further include bonding one of the plurality of dies on a printed circuit board (PCB) such that the HPC IC is oriented away from the PCB.

In still another aspect, the present disclosure provides a semiconductor structure. The semiconductor structure includes a first substrate including one high-performance computing integrated circuit (HPC IC), a second substrate including a plurality of electronic ICs (EICs) and bonded directly to the first substrate, and a third substrate including a plurality of photonic integrated circuits (PICs) and bonded directly to the second substrate.

In some embodiments, the third substrate comprises no molding material between adjacent ones of the plurality of PICs.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a printed circuit board;
   a first substrate comprising one high-performance computing integrated circuit (HPC IC) and bonded to the printed circuit board;
   a second substrate comprising a plurality of electronic ICs (EICs) and bonded directly to the first substrate such that the first substrate is disposed between the printed circuit board and the second substrate; and
   a third substrate comprising a plurality of photonic integrated circuits (PICs) and bonded directly to the second substrate,
   wherein no underfill material is present between the first substrate and the second substrate and between the second substrate and the third substrate.

2. The semiconductor device of claim 1, wherein spaces among the plurality of EICs are not filled with a molding material.

3. The semiconductor device of claim 1, wherein spaces among the plurality of PICs are not filled with a molding material.

4. The semiconductor device of claim 1,
   wherein the second substrate comprises first contact features embedded in a first dielectric layer,
   wherein the third substrate comprises second contact features embedded in a second dielectric layer,
   wherein surfaces of the first contact features are aligned and in contact with surfaces of the second contact features respectively,
   wherein surfaces of the first dielectric layer are in contact with surfaces of the second dielectric layer.

5. The semiconductor device of claim 1, wherein each of the plurality of PICs comprises photodiodes, waveguides, and modulators.

6. The semiconductor device of claim 1, wherein the plurality of EICs are free of photodiodes, waveguides, and modulators.

7. The semiconductor device of claim 1,
   wherein the plurality of EICs comprise between about 10 and about 100 EICs,
   wherein the plurality of PICs comprise between about 10 and about 100 PICs.

8. The semiconductor device of claim 1, wherein each of the plurality of PICs comprises an optical signal opening that extends partially into each of the plurality of PICs.

9. A semiconductor device, comprising:
   a base substrate;
   a first substrate comprising a plurality of photonic integrated circuits (PICs) and bonded directly to the base substrate;
   a second substrate comprising a plurality of electronic ICs (EICs) and bonded directly to the first substrate;
   a third substrate comprising one high-performance computing integrated circuit (HPC IC) and bonded directly to the second substrate; and
   an optical signal opening extending through the third substrate, the second substrate, and partially into the first substrate.

10. The semiconductor device of claim 9, wherein no underfill material is present between the first substrate and the second substrate and between the second substrate and the third substrate.

11. The semiconductor device of claim 9,
   wherein the second substrate comprises first contact features embedded in a first dielectric layer,
   wherein the third substrate comprises second contact features embedded in a second dielectric layer,
   wherein surfaces of the first contact features are aligned and in contact with surfaces of the second contact features respectively,
   wherein surfaces of the first dielectric layer are in contact with surfaces of the second dielectric layer.

12. The semiconductor device of claim 11,
   wherein the surfaces of the first contact features and the surfaces of the first dielectric layer are coplanar,
   wherein the surfaces of the second contact features and the surfaces of the second dielectric layer are coplanar.

13. The semiconductor device of claim 9, wherein each of the plurality of PICs comprises photodiodes, waveguides, and modulators.

14. The semiconductor device of claim 9, wherein spaces among the plurality of EICs are not filled with a molding material.

15. The semiconductor device of claim 9, wherein spaces among the plurality of PICs are not filled with a molding material.

16. A device structure, comprising:
   a first substrate comprising one high-performance computing integrated circuit (HPC IC);
   a second substrate comprising a plurality of electronic ICs (EICs) and bonded directly to the first substrate; and
   a third substrate comprising a plurality of photonic integrated circuits (PICs) and bonded directly to the second substrate,
   wherein each of the plurality of PICs comprises an optical signal opening that extends partially into each of the plurality of PICs.

17. The device structure of claim 16,
   wherein the first substrate comprises first contact features embedded in a first dielectric layer,
   wherein the second substrate comprises second contact features embedded in a second dielectric layer,
   wherein surfaces of the first contact features are aligned and in contact with surfaces of the second contact features respectively,
   wherein surfaces of the first dielectric layer are in contact with surfaces of the second dielectric layer.

18. The device structure of claim 17,
   wherein the surfaces of the first contact features and the surfaces of the first dielectric layer are coplanar,
   wherein the surfaces of the second contact features and the surfaces of the second dielectric layer are coplanar.

19. The device structure of claim 16,
   wherein the plurality of EICs comprise between about 10 and about 100 EICs,
   wherein the plurality of PICs comprise between about 10 and about 100 PICs.

20. The device structure of claim 16, wherein spaces among the plurality of EICs are not filled with a molding material.

* * * * *